(12) United States Patent
Rizzo

(10) Patent No.: US 6,828,853 B2
(45) Date of Patent: Dec. 7, 2004

(54) WIDE DYNAMIC RANGE DEMODULATOR FOR SMART CARDS OR CONTACTLESS TICKETS

(75) Inventor: Pierre Rizzo, Aubagne (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/351,601

(22) Filed: Jan. 24, 2003

(65) Prior Publication Data

US 2003/0160650 A1 Aug. 28, 2003

(30) Foreign Application Priority Data

Jan. 24, 2002 (FR) .............................................. 02 00899

(51) Int. Cl.[7] .................................................. H03D 1/00
(52) U.S. Cl. ........................ 329/347; 329/349; 235/439
(58) Field of Search ................................ 329/347, 349, 329/365, 370; 235/439, 380

(56) References Cited

U.S. PATENT DOCUMENTS

| | | | |
|---|---|---|---|
| 5,003,196 A | * | 3/1991 | Kawaguchi .................. 327/62 |
| 5,319,191 A | | 6/1994 | Crimmins ................ 250/214 R |
| 6,031,419 A | | 2/2000 | Roberts et al. .............. 329/349 |
| 6,621,720 B1 | * | 9/2003 | Devin et al. ................... 363/59 |

FOREIGN PATENT DOCUMENTS

| | | | |
|---|---|---|---|
| EP | 1058376 | 12/2000 | .......... H02M/7/219 |
| WO | 98/02840 | 1/1998 | ............ G06K/7/08 |
| WO | 01/71997 | 9/2001 | ........... H04L/25/06 |

* cited by examiner

*Primary Examiner*—Benny Lee
*Assistant Examiner*—Joseph Chang
(74) *Attorney, Agent, or Firm*—Lisa K. Jorgenson; Allen, Dyer, Doppelt, Milbrath & Gilchrist, P.A.

(57) ABSTRACT

A demodulator for an amplitude modulated alternating signal includes a peak detection circuit for extracting the reference modulating signal from the amplitude modulated alternating signal, and a first translation circuit for offsetting the level of the reference modulating signal by a value equal to the DC component to obtain an offset reference modulated signal. A comparison threshold generator circuit generates a comparison threshold to locate the start and the end of the modulation, and a comparator circuit compares the offset reference modulating signal with the comparison threshold for providing signals that cross the comparison threshold. An unregulated supply circuit provides a supply voltage to the different circuits.

18 Claims, 4 Drawing Sheets

WIDE DYNAMIC RANGE DEMODULATOR FOR SMART CARDS OR CONTACTLESS TICKETS

FIELD OF THE INVENTION

The invention relates to a demodulator that is based on the principle of peak detection for demodulating amplitude modulated alternating signals. The invention also relates to a contactless communication device including such a demodulator.

BACKGROUND OF THE INVENTION

Demodulators may be used in the field of long range radio frequency (RF) communications. Portable contactless communication devices, such as contactless smart cards, electronic tickets or swipe cards, operate based on communicating by a magnetic field with a read and/or write interrogating member, generally referred to as a reader. These contactless devices generally comprise a microcircuit connected to a parallel LC type resonant circuit. The induction coil L is an external antenna, while the capacitor C is integrated with the microcircuit. The assembly forms what is commonly termed a tuning circuit.

As an example, in certain contactless smart card applications, the reader emits a signal having a carrier frequency of 13.56 MHz. This emitted signal allows the contactless card to be supplied by induction with the energy necessary for it to operate, and a establishes communications between the card and the reader according to an established protocol. Thus, when the contactless card penetrates into the emission field of the reader, it communicates with the latter by a modulation operation which includes modifying at least one parameter of the carrier.

The contactless device receives from the reader a signal that is amplitude modulated by a tuning circuit. The interpretation of the message of thee reader by the contactless device is performed by a demodulation operation which includes extracting the modulated signal from the carrier. The frequency of the modulated signal is much lower than that of the carrier, generally tens of kHz.

The quality and reliability of the radio frequency RF communications are directly related, among other things, to the distance between the reader and the contactless device. The distance or the range of the RF communications between the reader and the contactless device depends on several parameters, such as the tuning frequency between the resonant circuit of the contactless device and the emission frequency of the reader signal, as well as the quality of the demodulation of the modulated signal.

The quality of the demodulation of the modulated signal depends directly on the distance between the contactless device and the reader, and also on the speed of displacement of the device in the emission field of the reader. The greater the range and the stealthier the device, the more the demodulation will be erroneous.

A block diagram of the input stages of the contactless device is illustrated in FIG. 1. A resonant circuit, centered on the carrier frequency, receives a modulated signal. A rectifier bridge generates a DC voltage in order to supply the contactless device. The voltage Vdb at the output of the rectifier bridge represents the DC voltage after rectification and contains both the energy necessary for the self-supply of the contactless device and the information of the modulated signal.

For applications using 100% amplitude modulation, a diode isolates the resonant circuit from the load and thus eliminates any possibility of current returning toward the resonant circuit. A limiter permits the supply voltage Vdd to be maintained below a threshold, such as 4 V, for example. A resistor is advantageously placed between Vdb and the diode in order to isolate the signal modulated on Vdb. Thus, the demodulation of the modulated signal coming from the reader occurs directly from the signal Vdb at the output of the rectifier bridge of the contactless device.

A conventional amplitude demodulation device is illustrated schematically in FIG. 2. The signal Vdb is first treated by an RC type low pass filter to eliminate components of the carrier wave, to extract from it the envelope of the modulated signal, commonly referred to as the reference modulating signal Vmod, and its DC component, DC. A cutoff frequency of several tens of kHz can be chosen for this first filter. The DC level is then extracted by a new low pass filter having a cutoff frequency lower than the frequency of the modulating signal Vmod, such as by several kHz, for example. The demodulation signal Vdemod can then be obtained by comparing the reference modulating signal Vmod and its DC level.

This type of demodulation device has limitations due to its own structure. The DC level is widely variable as a function of the positioning of the card in the field of the reader, and of its speed of displacement. This makes the generation of a reliable comparison level difficult to permanently obtain. This problem is even accentuated for applications where a great range, such as 50 cm to 1 m is required.

The graphs of FIGS. 3a–3c illustrate them limits of conventional demodulation devices. The reference modulating signal Vmod is shown in FIG. 3a with its DC level, DC. The demodulation signal Vdemod is shown in FIG. 3b. It can be seen that certain modulations may not be detected, and that the modulations identified by the device are not identified perfectly, that is, the start and end of the modulation are not precisely located.

FIG. 3c illustrates, for a contactless device, a demodulator capable of precisely locating the start and the end of all the modulated signals emitted by the reader. To remedy these disadvantages, the Applicant has described in U.S. patent application Ser. No. 3,606 filed Mar. 25, 2000, a demodulator that is termed active based on the principle of detecting peaks and valleys. This active demodulator is able to generate, by following the modulated signal in a dynamic fashion, a low threshold and a high threshold which enables the start and end of the modulation to be precisely located.

Such a modulator is principally formed by two independent demodulators, F.E. and R.E. (FIG. 4), respectively optimized for the detection of the start and the end of the modulated signal. This demodulator comprises a peak detection cell DCR for extracting the reference modulating signal Vpeak1 from the modulated signal Vdb, a first demodulator FE for detecting the peak of the reference modulating signal Vpeak to generate a high comparison threshold and to locate the start of the modulation, and a second demodulator RE for detecting a valley of the reference modulating signal Vpeak to generate a low comparison threshold and to locate the end of the modulation. The demodulator further comprises a logic processing unit for providing the demodulated signal Vdemod.

For this purpose, peak detection is performed starting from a base cell diagrammed in FIG. 5. Such a cell essentially includes a diode D, a capacitor C and a DC current source I, and permits the reference modulating signal Vpeak to be extracted from the modulated signal Vdb.

Considering a full wave modulated signal Vdb, the capacitor C can only charge during the positive half cycle of Vdb, that is, when Vdb−Vpeak>Vd, wherein Vd is the threshold voltage of the diode. As soon as this relationship no longer holds, the diode of the base cell turns off and the capacitor C has a memory effect, that is, at the moment the diode turns off, Vpeak=Vdb(peak)−Vd very precisely. The capacitor C is then discharged at a constant current and Vpeak decreases according to the equation dVpeak/dt=i/C.

Consequently, it is necessary to choose a time constant that is suitable for recovering the modulated signal without attenuation, while limiting the resultant due to the carrier wave. The frequency of the modulated signal is slow with respect to that of the frequency.

The demodulator for peak and valley detection that has just been described has an input dynamic range that is limited by that of the comparator, which is between [Vtn−Vdd]. The useful level of the signal Vdb may reach voltages of 12 volts, while the comparator supply voltage Vdd is generally regulated between 3 and 5 volts. As a result, communication gaps appear at an elevated coupling with the reader.

SUMMARY OF THE INVENTION

In view of the foregoing background, an object of the present invention is to provide a demodulator for amplitude modulated alternating signals that do not exhibit communication gaps.

This object is achieved by using peak detectors for a comparator to detect the start and end of the modulation and by supplying the peak detectors and the comparator with an unregulated supply voltage.

The invention therefore relates to a demodulator for an amplitude modulated alternating signal, characterized in that it comprises a peak detection circuit for extracting the reference modulating signal from the modulated signal, and a first translations circuit for offsetting the level of the reference modulating signal by a value equal to the DC component to obtain an offset reference modulated signal. A circuit generates a comparison threshold to locate the start and the end of the modulation.

The demodulator preferably further comprises a comparator circuit for comparing the offset reference modulated signal with the comparison threshold, and for providing signals crossing the comparison threshold. An unregulated supply circuit preferably provides a supply voltage to the different circuits. This demodulator may further comprise a second translation circuit for offsetting the level of the signals provided by the comparators to the value of the regulated supply voltage.

BRIEF DESCRIPTION OF THE DRAWINGS

Other characteristics and advantages of the present invention will become apparent on reading the following description of a specific example of embodiment. The description uses the accompanying drawings, in which.

DETAILED DESCRIPTION OF THE PREFERRED EMBODIMENTS

In the following description, reference is made to a contactless communication card receiving from a card reader an amplitude modulated alternating signal, whose carrier frequency is 13.56 MHz and whose modulation index is 10%. The application calls for a range of radio frequency communication that can reach one meter for a 3 m/s speed of displacement of the card in which the magnetic field of the reader is able to reach.

Figure 6:
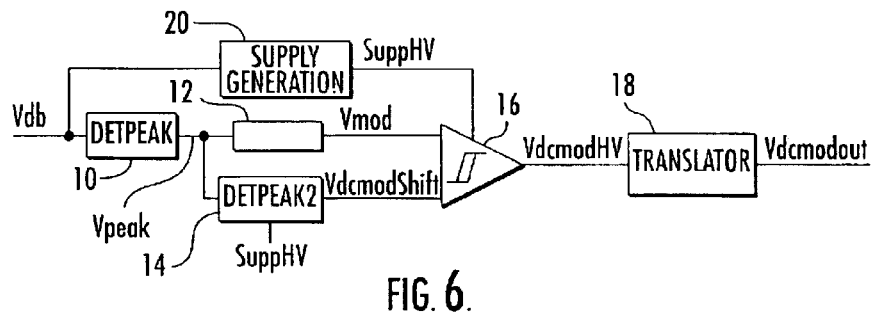
FIG. 6 is a functional diagram of an amplitude modulated signal demodulator according to the present invention.
Figure 8:
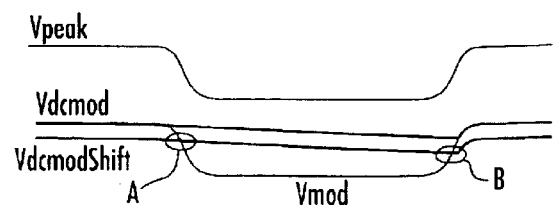
FIG. 8 schematically illustrates the different voltages at different points of the diagrams of FIGS. 6 and 7.

According to the functional diagram of FIG. 6, the demodulator according to the invention comprises the following. A peak detection circuit 10 (DetPeak1) receives an amplitude modulated high frequency (13.56 MHz) signal Vdb (FIG. 9) at its input terminal, and provides at its output terminal a reference modulating signal Vpeak which forms the envelope of the signal Vdb. A first translation circuit 12 receives the signal Vpeak at its input terminal, and provides at its output a signal Vmod that is the signal Vpeak offset by the DC component Vdcmod.

A comparison threshold generating circuit 14 receives the signal Vpeak at its input terminal, and provides at its output terminal the threshold signal Vdcmodshift which is the DC component signal Vdcmod offset by a certain value. A comparator circuit 16 receives at a first input the threshold signal Vdcmodshift provided by the generator circuit 14, and at a second input the signal Vmodul provided by the first translation circuit 12. This comparison circuit provides at its output terminal a signal VdcmodHV that begins when the signal Vmodul becomes lower than the threshold Vdcmodshift (point A), and ends when the signal Vmod becomes higher than the threshold Vdcmodshift (point B).

Figure 7:
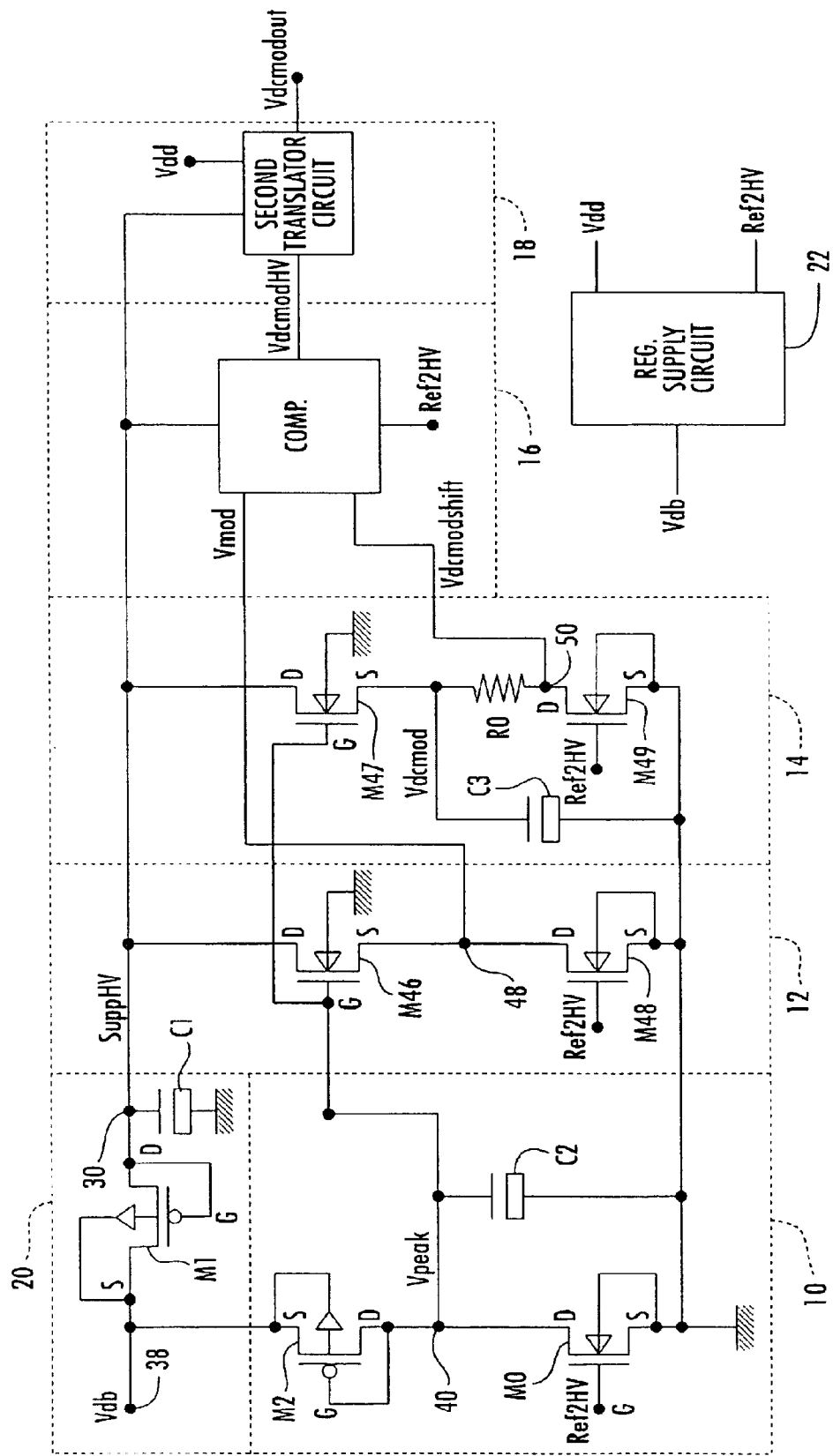
FIG. 7 is a detailed diagram of the demodulator according to the present invention.

A second translation circuit 18 receives at its input terminal the signal VdcmodHV provided by the comparator circuit 16, and provides at its output terminal a signal Vdcmodout which results from the offsetting of the signal Vdcmodout toward the level Vdd corresponding to a regulated supply voltage provided by a supply circuit 22 (FIG. 7). An unregulated supply circuit 20 receives at its input terminal the modulated signal Vdb, and provides at its output terminal an unregulated supply voltage SuppHV. This voltage SuppHV is applied to the above different circuits if needed, and specifically, to the circuits 12, 14, 16 and 18.

Figure 1:
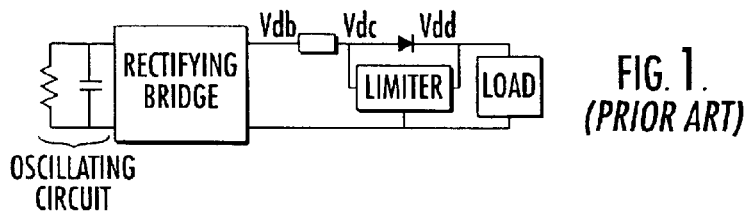
FIG. 1 is a functional diagram of the input circuits of a contactless communication device according to the prior art.
Figure 2:
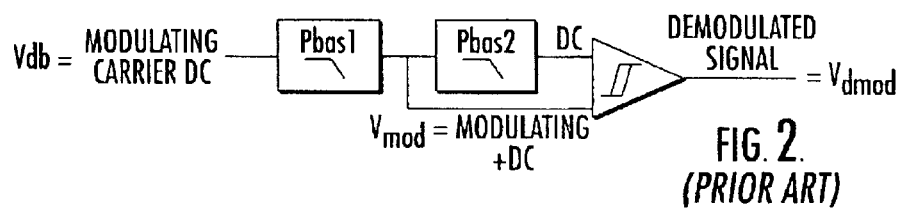
FIG. 2 is a functional diagram showing a demodulation circuit for amplitude modulated alternating signals according to the prior art.
Figure 3A:
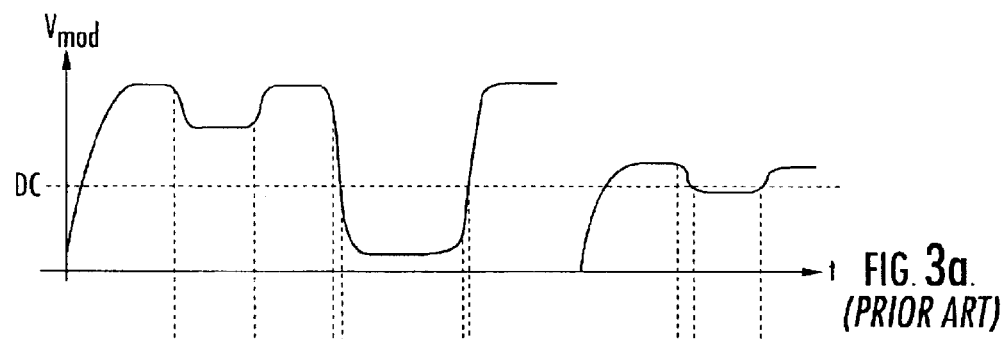
FIGS. 3a, 3b and 3c are curves respectively illustrating the modulated signal and its DC level, the signal demodulated by a conventional device, and the signal demodulated using a modulator according to the diagram of FIG. 4.
Figure 3B:
Figure 3C:
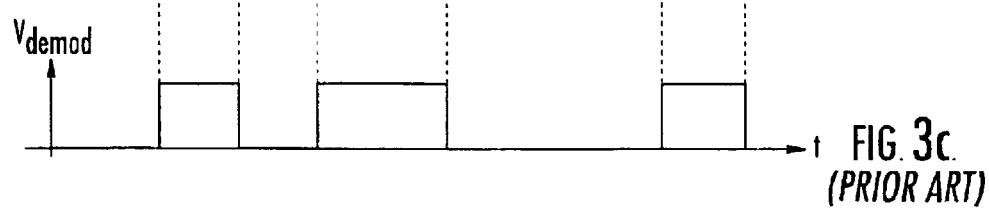
Figure 4:
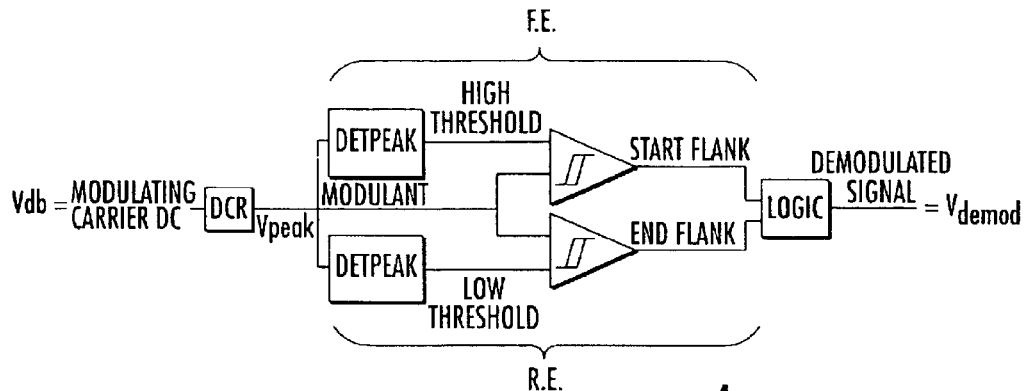
FIG. 4 is a diagram of a peak and valley detection demodulator according to the prior art.
Figure 5:
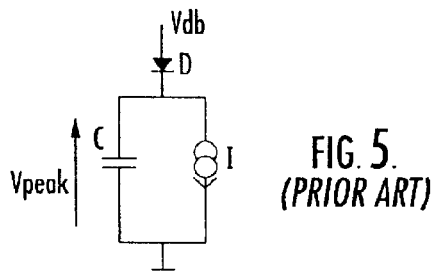
FIG. 5 is a diagram showing the principle of a peak detection circuit according to the prior art.

The use of an unregulated supply voltage SuppHV for the demodulator circuits according to the invention permits the demodulator to have an unlimited advantage for the whole dynamic range of the modulated signal Vdb, and specifically, for detecting a signal modulated with a very large amplitude due, for example, to the immediate proximity of the card reader. If this signal has a very large amplitude, it would lead to a communication gap in the prior art demodulator (FIG. 3b).

FIG. 7 is a detailed diagram of the embodiment of certain circuits of the diagram of FIG. 6, namely the circuits referenced 10, 12, 14 and 20. The unregulated supply circuit 20 comprises a P-type (PMOS) MOS transistor M1 mounted as a diode by connecting the drain and gate electrodes together. The drain of the transistor M1 is connected to the ground terminal via a decoupling capacitor C1 which serves to regulate the voltage at the point 30 for the duration of a modulation signal Vdb applied to the point 38 on the source of the transistor M1. The modulation signal Vdb is shown by the curve 32 of FIG. 9. The supply voltage SuppHV is taken at the point 30 and supplies the other circuits 12, 14, 16 and 18.

The peak detection circuit 10 performs a peak detection at the front of the demodulator for extracting a reference signal Vpeak from the antenna signal Vdb that it receives at the source of a PMOS transistor M2 mounted as a diode by connecting the gate and drain electrodes together.

Figure 10:
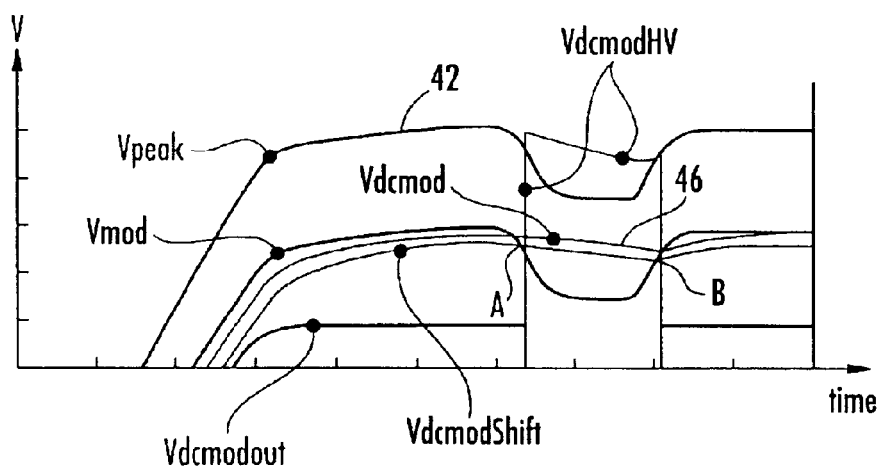
FIG. 10 illustrates the curves of different signals at different points of the demodulator according to the present invention.

The drain of the transistor M2 is connected to ground via a circuit having in parallel NMOS transistor M0 and a capacitor C2. The signal Vpeak, taken at the point 40, is shown by the curve 42 of FIG. 10.

The time constant provided by the transistor MO and the capacitor C2 is sufficiently small to recover the maximum of the modulation of the signal Vdb. The signal Vpeak is applied to the translation circuit 12 which provides the signal Vmod and to the comparison threshold generator circuit 14 that provides the signal Vdcmod.

The circuits 12 and 14 are analogous in that they each include a follower transistor M46 or M47 brazed by a reference transistor M48 or M49. The follower transistor M46 or M47 is of the NMOS type. The drain is connected to the supply voltage SuppHV and the gate receives the voltage Vpeak. The reference transistor M48 or M49 is likewise of the NMOS type, and the drain is connected to the source of the follower transistor M46 or M47. The gate of the reference transistor M48 or M49 is connected to a reference voltage Ref2HV, while the source is connected to ground.

Figure 9:
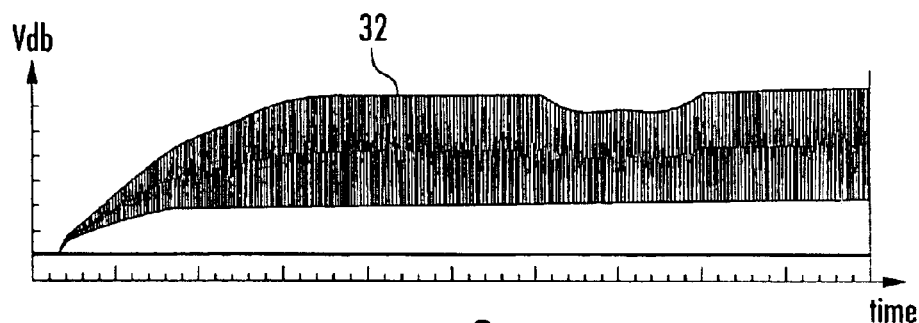
FIG. 9 illustrates the amplitude modulated high frequency signal Vdb according to the present invention.

The reference transistor M49 is mounted in parallel with a capacitor C3 to introduce a time constant on the signal Vmod, and to obtain the signal Vdcmod (curve 46, FIG. 9). When the capacitor C3 is discharged and in the absence of modulation, follower transistor M47 charges the capacitor to thee value Vdcmod≈Vpeak−Vgs≈Vmod.

During a fall of the level of Vpeak, Vmod is stored by the capacitor C3 so that Vpeak−Vgs<Vdcmod, which turns off the transistor M47. The capacitor C3 is discharged by the biasing current M47 as long as Vpeak−Vgs<Vmod. The discharge of the capacitor C3 is slow relative to the modulation, but should be faster than a possible fall of the supply voltage SuppHV when the card moves away from the reader.

The signal Vdcmod locates the peak of the modulation signal Vmod to create a comparison threshold by a level offset, using the voltage drop through a resistor R0 connected between the drain of the transistor M49 and the source of the transistor M48. At the end of the modulation, the transistor M47 conducts again when Vpeak−Vgs>Vdcmod, so that the capacitor C3 is charged again and Vdcmod≈Vmod with Vmod again crossing Vdcmodshift.

The crossing of Vmod and Vdcmodshift results at the start and the end of the modulation. To ensure a specified agreement of the signals Vmod and Vdcmod during a peak of the modulation signal, the pairs of transistors M46, M47 and M48, M49 are matched.

The comparator 16 is of the type with hysteresis and comprises transistors that withstand high voltages. It exhibits, for example, a hysteresis of 50 mV to eliminate possible multiple transitions due to the residual component of the signal at the carrier frequency. The thresholds for triggering are then 250 mV at the start of the modulation and 150 mV at the end of the modulation.

The output signal VdcmodHV of the comparator 16 has a swing between the supply voltage SuppHV and ground. It is applied to a translation circuit 18 which comprises, for example, an inverter circuit supplied by Vdd and accepts the signal VdcmodHV at its input, and provides a signal Vdcmodout at its output, the swing of which is between Vdd and ground.

What is claimed is:

1. A demodulator for demodulating an amplitude modulated alternating signal comprising:
    a peak detection circuit for detecting a reference modulating signal from the amplitude modulated alternating signal;
    a first translation circuit connected to said peak detection circuit for offsetting a level of the reference modulating signal by a value equal to a DC component to obtain an offset reference modulated signal;
    a comparison threshold generator circuit connected to said first translation circuit for generating a comparison threshold for locating a start and an end of the modulation;
    a comparator circuit connected to said comparison threshold generator circuit for comparing the offset reference modulated signal with the comparison threshold, and for providing signals crossing the comparison threshold; and
    a supply circuit for providing an unregulated supply voltage to said first translation circuit, to said comparison threshold generator circuit and to said comparator circuit.

2. A demodulator according to claim 1, further comprising a second translation circuit connected to said comparator circuit for offsetting a level of the signals provided by said comparator circuit for adapting them to a different supply voltage.

3. A demodulator according to claim 1, wherein said first translation circuit comprises in series:
    a first follower transistor comprising a gate for receiving the modulating reference signal, a drain for receiving the supply voltage, and a source; and
    a first biasing transistor comprising a gate connected to a first voltage reference, a source connected to a second voltage reference, and a drain connected to the source of said first follower transistor at a first common node, with the offset reference modulated signal being taken at the first common node.

4. A demodulator according to claim 1, wherein said comparison threshold generator circuit comprises:
    a second follower transistor comprising a gate for receives the modulating reference signal, a drain for receiving the supply voltage, and a source;
    a resistor connected to said source;
    a capacitor connected between said source and a voltage reference; and
    a second biasing transistor comprising a gate for receiving a first voltage reference, a drain connected to said resistor at a second common node, and a source connected to a second voltage reference, with the comparison threshold being taken at the second common node.

5. A demodulator for demodulating an amplitude modulated alternating signal comprising:
   a peak detection circuit for detecting a reference modulating signal from the amplitude modulated alternating signal;
   a first translation circuit connected to said peak detection circuit for offsetting a level of the reference modulating signal by a value equal to a DC component of the amplitude modulated alternating signal to obtain an offset reference modulated signal;
   a comparison threshold generator circuit connected to said first translation circuit for generating a comparison threshold for locating a start and an end of the modulation;
   a comparator circuit connected to said comparison threshold generator circuit for comparing the offset reference modulated signal with the comparison threshold, and for providing signals crossing the comparison threshold.

6. A demodulator according to claim 5, further comprising a supply circuit for providing an unregulated supply voltage to said first translation circuit, to said comparison threshold generator circuit and to said comparator circuit.

7. A demodulator according to claim 5, further comprising a second translation circuit connected to said comparator circuit for offsetting a level of the signals provided by said comparator circuit for adapting them to a different supply voltage.

8. A demodulator according to claim 5, wherein said first translation circuit comprises in series:
   a first follower transistor comprising a gate for receiving the modulating reference signal, a drain for receiving the supply voltage, and a source; and
   a first biasing transistor comprising a gate connected to a first voltage reference, a source connected to a second voltage reference, and a drain connected to the source of said first follower transistor at a first common node, with the offset reference modulated signal being taken at the first common node.

9. A demodulator according to claim 5, wherein said comparison threshold generator circuit comprises:
   a second follower transistor comprising a gate for receives the modulating reference signal, a drain for receiving the supply voltage, and a source;
   a resistor connected to said source;
   a capacitor connected between said source and the voltage reference; and
   a second biasing transistor comprising a gate for receiving a first voltage reference, a drain connected to said resistor at a second common node, and a source connected to a second voltage reference, with the comparison threshold being taken at the second common node.

10. A contactless smart card comprising:
    a tuning circuit for receiving an amplitude modulated alternating signal; and
    a demodulator connected to said tuning circuit for demodulating the amplitude modulated alternating signal, said demodulator comprising
    a peak detection circuit for detecting a reference modulating signal from the amplitude modulated alternating signal,
    a first translation circuit connected to said peak detection circuit for offsetting a level of the reference modulating signal to obtain an offset reference modulated signal,
    a comparison threshold generator circuit connected to said first translation circuit for generating a comparison threshold for locating a start and an end of the modulation, and
    a comparator circuit connected to said comparison threshold generator circuit for comparing the offset reference modulated signal with the comparison threshold, and for providing signals crossing the comparison threshold, and
    a supply circuit for providing an unregulated supply voltage to said first translation circuit, to said comparison threshold generator circuit and to said comparator circuit.

11. A contactless smart card according to claim 10, wherein said tuning circuit comprises a resonant circuit.

12. A contactless smart card according to claim 10, wherein said first translation circuit offsets a level of the reference modulating signal by a value equal to a DC component of the amplitude modulated alternating signal.

13. A contactless smart card according to claim 10, wherein said demodulator further comprises a second translation circuit connected to said comparator circuit for offsetting a level of the signals provided by said comparator circuit for adapting them to a different supply voltage.

14. A contactless smart card according to claim 10, wherein said first translation circuit comprises in series:
    a first follower transistor comprising a gate for receiving the modulating reference signal, a drain for receiving the supply voltage, and a source; and
    a first biasing transistor comprising a gate connected to a first voltage reference, a source connected to a second voltage reference, and a drain connected to the source of said first follower transistor at a first common node, with the offset reference modulated signal being taken at the first common node.

15. A contactless smart card according to claim 10, wherein said comparison threshold generator circuit comprises:
    a second follower transistor comprising a gate for receives the modulating reference signal, a drain for receiving the supply voltage, and a source;
    a resistor connected to said source;
    a capacitor connected between said source and the voltage reference; and
    a second biasing transistor comprising a gate for receiving a first voltage reference, a drain connected to said resistor at a second common node, and a source connected to a second voltage reference, with the comparison threshold being taken at the second common node.

16. A method for demodulating an amplitude modulated alternating signal, comprising:
    detecting a reference modulating signal from the amplitude modulated alternating signal;
    offsetting a level of the reference modulating signal by a value equal to a DC component of the amplitude modulated alternating signal to obtain an offset reference modulated signal;
    generating a comparison threshold for locating a start and an end of the modulation; and
    comparing the offset reference modulated signal with the comparison threshold, and providing signals crossing the comparison threshold.

17. A method according to claim 16, further comprising offsetting a level of the signals crossing the comparison threshold for adapting them to a different supply voltage.

18. A method according to claim 16, wherein the detecting is performed by a peak detector circuit; wherein the offsetting is performed by a first translation circuit; wherein the generating is performed by a comparison threshold generator circuit; and wherein the comparing is performed by a comparator circuit; the method further comprising providing an unregulated supply voltage to these circuits.

* * * * *

UNITED STATES PATENT AND TRADEMARK OFFICE
CERTIFICATE OF CORRECTION

PATENT NO. : 6,828,853 B2
DATED : December 7, 2004
INVENTOR(S) : Rizzo

It is certified that error appears in the above-identified patent and that said Letters Patent is hereby corrected as shown below:

Column 1,
Line 30, delete "a"
Line 38, delete "thee" insert -- the --

Column 2,
Line 31, delete "them" insert -- the --
Line 42, delete "U.S." insert -- French --

Column 3,
Line 50, delete "comparators" insert -- comparator --

Column 5,
Line 49, delete "thee" insert -- the --

Column 6,
Line 60, delete "receives" insert -- receiving --

Column 7,
Line 46, delete "receives" insert -- receiving --
Line 59, delete "contactiess" insert -- contactless --

Column 8,
Lines 19 and 23, delete "contactiess" insert -- contactless --
Line 42, delete "receives" insert -- receiving --

Signed and Sealed this

Seventeenth Day of May, 2005

JON W. DUDAS
*Director of the United States Patent and Trademark Office*